(12) United States Patent
Tong

(10) Patent No.: US 11,071,195 B1
(45) Date of Patent: Jul. 20, 2021

(54) HEATSINK AND STIFFENER MOUNT WITH INTEGRATED ALIGNMENT

(71) Applicant: Google LLC, Mountain View, CA (US)

(72) Inventor: Ryan Tong, Hercules, CA (US)

(73) Assignee: Google LLC, Mountain View, CA (US)

(*) Notice: Subject to any disclaimer, the term of this patent is extended or adjusted under 35 U.S.C. 154(b) by 0 days.

(21) Appl. No.: 17/004,769

(22) Filed: Aug. 27, 2020

Related U.S. Application Data

(60) Provisional application No. 63/035,311, filed on Jun. 5, 2020.

(51) Int. Cl.
| | | |
|---|---|---|
| *H05K 1/02* | (2006.01) | |
| *F28F 9/26* | (2006.01) | |
| *H05K 7/20* | (2006.01) | |

(52) U.S. Cl.
CPC ........... *H05K 1/0203* (2013.01); *F28F 9/266* (2013.01); *H05K 7/2039* (2013.01); *F28F 2280/04* (2013.01); *H05K 2201/066* (2013.01); *H05K 2201/10598* (2013.01)

(58) Field of Classification Search
CPC ............... H05K 1/0203; H05K 7/2039; H05K 2201/10598; H05K 2201/066; H05K 1/0204; H05K 1/0271; H05K 3/0061; H05K 2201/2036; H05K 2201/10734; H05K 2201/10409; H05K 2201/2009; H05K 1/021; H05K 1/0209; H05K 7/1407; F28F 9/266; F28F 2280/04; H01L 23/4006; H01L 2224/16225; H01L 2924/16152; H01L 2224/73253; H01L 2924/15311; H01L 2224/73204; H01L 2224/32225; H01L 2924/19105; H01L 2924/00014; H01L 2924/00011
See application file for complete search history.

(56) References Cited

U.S. PATENT DOCUMENTS

| | | | | |
|---|---|---|---|---|
| 3,461,769 A | * | 8/1969 | Brosseit | F16B 5/0266 411/385 |
| 5,713,690 A | | 2/1998 | Corbin, Jr. et al. | |
| 6,280,202 B1 | * | 8/2001 | Alden | H05K 7/142 174/138 D |
| 6,307,748 B1 | | 10/2001 | Lin et al. | |
| 6,480,387 B1 | | 11/2002 | Lee et al. | |
| 6,639,800 B1 | | 10/2003 | Eyman et al. | |
| 6,778,396 B2 | | 8/2004 | Liu | |
| 6,826,054 B2 | | 11/2004 | Liu | |
| 7,042,727 B2 | | 5/2006 | Ulen et al. | |

(Continued)

FOREIGN PATENT DOCUMENTS

| | | |
|---|---|---|
| CN | 103596405 A | 2/2014 |
| EP | 1081994 A2 | 3/2001 |

OTHER PUBLICATIONS

Extended European Search Report for European Patent Application No. 20213025.8 dated Jun. 7, 2021. 8 pages.

*Primary Examiner* — Steven T Sawyer
(74) *Attorney, Agent, or Firm* — Lerner, David, Littenberg, Krumholz & Mentlik, LLP

(57) ABSTRACT

A mount for connecting a heat sink to a PCB may include a threaded post extending along an axis, a first barrel adjacent to the post along an axis and having a larger axial cross-section than the post, and a threaded second barrel defining an opposite end of the mount from the post and having a larger axial cross-section than the first barrel.

10 Claims, 6 Drawing Sheets

(56) References Cited

U.S. PATENT DOCUMENTS

| | | |
|---|---|---|
| 7,262,969 B2 | 8/2007 | Lee et al. |
| 7,315,449 B2 * | 1/2008 | Lewis ................ H01L 23/4006 165/80.3 |
| 7,333,340 B2 | 2/2008 | Zhang et al. |
| 7,342,796 B2 | 3/2008 | Aukzemas |
| 7,345,881 B2 | 3/2008 | Colbert et al. |
| 7,359,200 B2 | 4/2008 | Zhou et al. |
| 7,468,889 B2 | 12/2008 | Su |
| 7,839,644 B2 | 11/2010 | Ye et al. |
| 7,870,888 B2 | 1/2011 | Zhou et al. |
| 8,432,698 B2 | 4/2013 | Liu |
| 9,591,781 B2 * | 3/2017 | Vanderveen ....... H01R 12/7047 |
| 9,659,804 B2 | 5/2017 | Ke et al. |
| 2002/0114137 A1 * | 8/2002 | Pearson ............. H01L 23/4093 361/709 |
| 2004/0105236 A1 | 6/2004 | Lee et al. |
| 2004/0264142 A1 * | 12/2004 | Mejia ................ H01L 23/427 361/719 |
| 2005/0036289 A1 | 2/2005 | Lee et al. |
| 2005/0072558 A1 | 4/2005 | Whitney et al. |
| 2005/0083661 A1 | 4/2005 | Lee et al. |
| 2005/0135064 A1 | 6/2005 | Chen et al. |
| 2006/0007659 A1 | 1/2006 | Lee et al. |
| 2007/0019381 A1 * | 1/2007 | Veh ......................... G06F 1/20 361/679.46 |
| 2007/0047208 A1 * | 3/2007 | Zhou ..................... H01L 23/467 361/704 |
| 2007/0091576 A1 | 4/2007 | Wung et al. |
| 2007/0217159 A1 | 9/2007 | Long et al. |
| 2007/0230125 A1 | 10/2007 | Lo et al. |
| 2008/0151504 A1 * | 6/2008 | Eckberg ............. H01L 23/4006 361/715 |
| 2008/0174952 A1 | 7/2008 | Ye et al. |
| 2008/0284005 A1 | 11/2008 | Wong |
| 2008/0310118 A1 * | 12/2008 | Brocklesby ............. H01L 21/50 361/719 |
| 2009/0093142 A1 | 4/2009 | Lin et al. |
| 2010/0097766 A1 | 4/2010 | Wu et al. |
| 2010/0122458 A1 * | 5/2010 | Woods, Jr. ............. H01R 12/58 29/884 |
| 2010/0220447 A1 | 9/2010 | Nie et al. |
| 2010/0226102 A1 * | 9/2010 | So ....................... H01L 23/4006 361/748 |
| 2011/0038125 A1 | 2/2011 | Cao et al. |
| 2011/0103016 A1 | 5/2011 | Tang et al. |
| 2013/0189049 A1 | 7/2013 | Stotz, Jr. |
| 2014/0362528 A1 * | 12/2014 | Takeuchi .......... H05K 7/20172 361/679.54 |
| 2015/0062827 A1 * | 3/2015 | Aizawa ................ H05K 7/2049 361/720 |
| 2015/0152906 A1 | 6/2015 | Lai et al. |
| 2019/0304869 A1 | 10/2019 | Larson et al. |
| 2019/0306985 A1 | 10/2019 | Ferguson et al. |

* cited by examiner

HEATSINK AND STIFFENER MOUNT WITH INTEGRATED ALIGNMENT

CROSS-REFERENCE TO RELATED APPLICATIONS

The present application claims the benefit of the filing date of U.S. Provisional Patent Application No. 63/035,311 filed Jun. 5, 2020, the disclosure of which is hereby incorporated herein by reference.

BACKGROUND

Electronic components such as circuit boards generate heat during operation. Elevated temperatures decrease the efficiency and longevity of such components. Various solutions for heat dissipation have therefore been developed. Some solutions include the use of a heat sink attached to the board. One example of a typical heat sink is a block of metal fins, but a wide variety of heat sinks exist.

Thermal contact conductance between the board and the heat sink is an important factor for effective heat dissipation. Thermal contact conductance can be improved by increasing pressure between abutting surfaces of the heat sink and board. Known solutions for tightening the heat sink to the board include elements that extend through the board that can be pulled from the opposite side of the heat sink, such as screws. Typically, the point of contact between the board and the heat sink is a chip that projects outward from an approximately central location of the board. Because only the chip contacts the heat sink directly, tightening the screws or other tightening elements at peripheral locations around the board may cause the board to bend, which reduces the contact area between the chip and the heat sink and may damage the board.

BRIEF SUMMARY

An aspect of the present disclosure is an electronic assembly, which may include a printed circuit board, or PCB, a heat sink, a bolster plate, and mounts. The PCB and bolster plate may include holes near their respective corners. The mounts may serve to align the bolster plate to the printed circuit board by passing through the holes in the PCB and threadingly engaging the holes in the bolster plate. The mounts may include a portion that is too large in cross-section to pass through the holes in the PCB, which may thereby enable the mounts to retain the bolster plate against the PCB. The mounts may also be engageable by load cells connected to the heat sink, thereby also aligning the heat sink to the PCB. The mounts may transfer force from the load cells to the bolster plate so that the bolster plate presses the PCB against the heat sink. The mounts may provide an element of configurability/flexibility. For example, while in some implementations two mounts may be used, in other implementations three, four, or another number of mounts may be used.

In another aspect, a mount for connecting a heat sink to a PCB may include a threaded post extending along an axis, a first barrel adjacent to the post along an axis and having a larger axial cross-section than the post, and a threaded second barrel defining an opposite end of the mount from the post and having a larger axial cross-section than the first barrel.

In some arrangements, the mount may include a grip axially between the first barrel and the second barrel.

In some arrangements, the grip may have a larger axial cross-section than the first barrel.

In some arrangements, the grip may have a larger axial cross-section than the second barrel.

In some arrangements, the grip may have a polygonal axial cross-section.

In some arrangements, the post may be externally threaded.

In some arrangements, the second barrel may be internally threaded.

In some arrangements, an end of the first barrel closest to the post may include a circumferential chamfer reducing a diameter of the axial cross-section of the second barrel with increasing proximity to the post.

In another aspect, an electronic assembly, may include a PCB including PCB holes, a bolster plate including bolster plate holes, each bolster plate hole being concentrically aligned with one of the PCB holes, a heat sink including notches and contacting an opposite side of the PCB from the bolster plate, load cells extending within the notches and each being concentrically aligned with one of the PCB holes and one of the bolster plate holes, and one or more mounts. The mounts may each include a post extending along an axis and engaged with one of the bolster plate holes, a first barrel axially adjacent to the post and having a larger axial cross-section than the post, and a second barrel defining an axially opposite end of the mount from the post and engaged with one of the load cells.

In some arrangements, each load cell may include a coil spring and a screw extending within the coil spring.

In some arrangements, the coil spring may be confined between a first point at a fixed location relative to the screw and a second point at a fixed location relative to the heat sink.

In some arrangements, each of the screws may include an internally threaded portion engaged with an internally threaded bore within the second barrel of one of the mounts.

In some arrangements, the second barrel of each mount may have a larger axial cross-section than the respective post.

In some arrangements, the PCB holes may have an approximately equal diameter to the second barrels.

In some arrangements, each mount may include a grip located axially between the first barrel and the second barrel, and each grip includes a flat surface abutting the PCB.

In some arrangements, the PCB may include a chip on a side of the PCB facing the heat sink.

In some arrangements, the heat sink may include a contact abutting the chip extending from a surface of the heat sink facing the PCB.

In some arrangements, the heat sink may include a tab defining an end of each notch, each tab including a channel extending therethrough, and each of the second barrels is disposed within one of the channels.

In another aspect, a method of assembling electronic components may include inserting a post of a mount through a PCB hole in a PCB and into a bolster plate hole in a bolster plate, engaging a load cell of a heat sink with an opposite end of the mount from the post, and tightening the load cell to bring a chip on the PCB into abutment with a contact surface of the heat sink.

In some arrangements, the method may include engaging the post with the bolster plate hole and tightening the mount to the bolster plate until the PCB contacts the bolster plate and a grip of the mount abuts an opposite side of the PCB from the bolster plate.

DETAILED DESCRIPTION

Figure 1A:
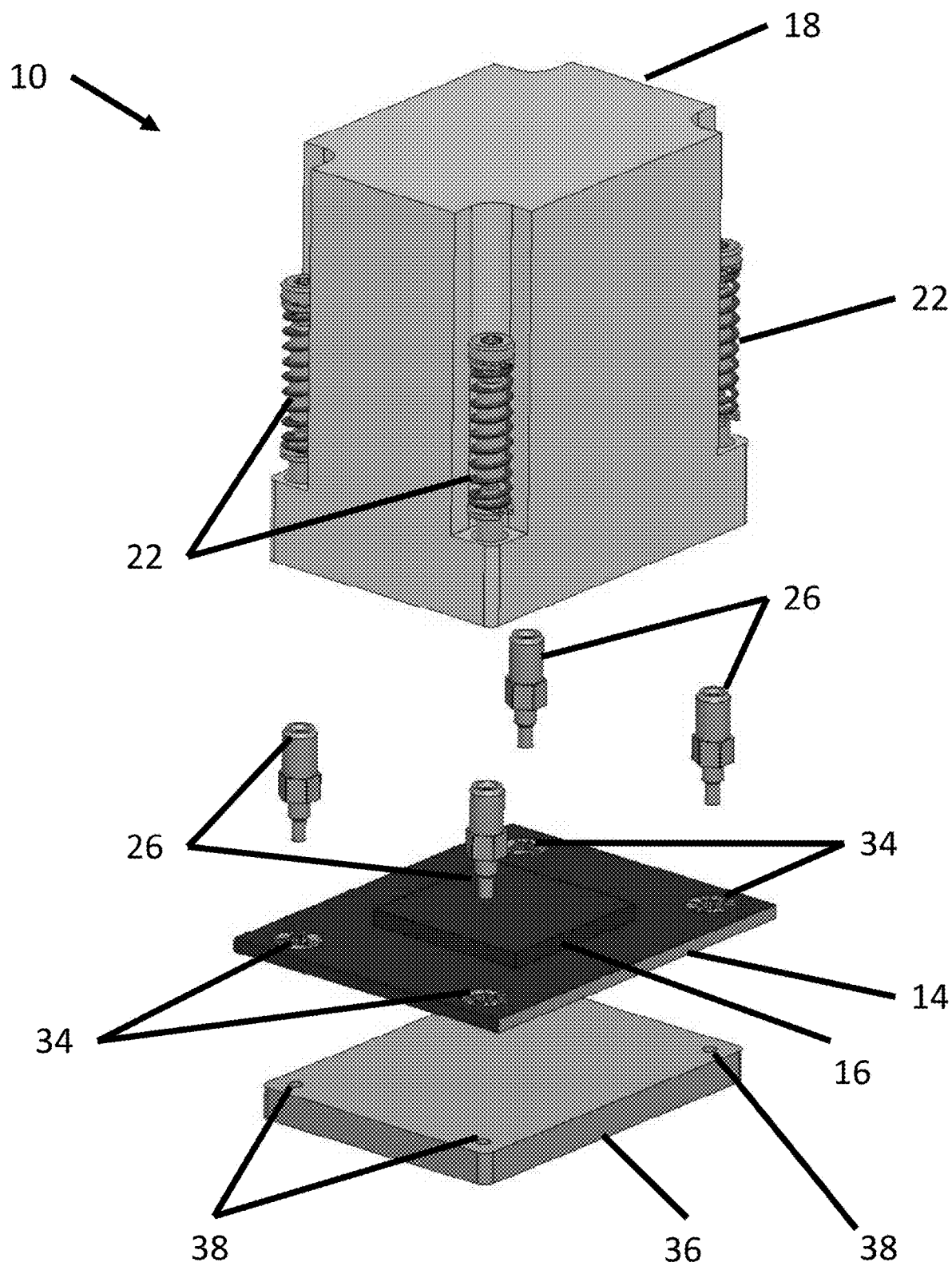
FIG. 1A is an exploded perspective view of an electronic assembly according to an aspect of the disclosure.
Figure 1B:
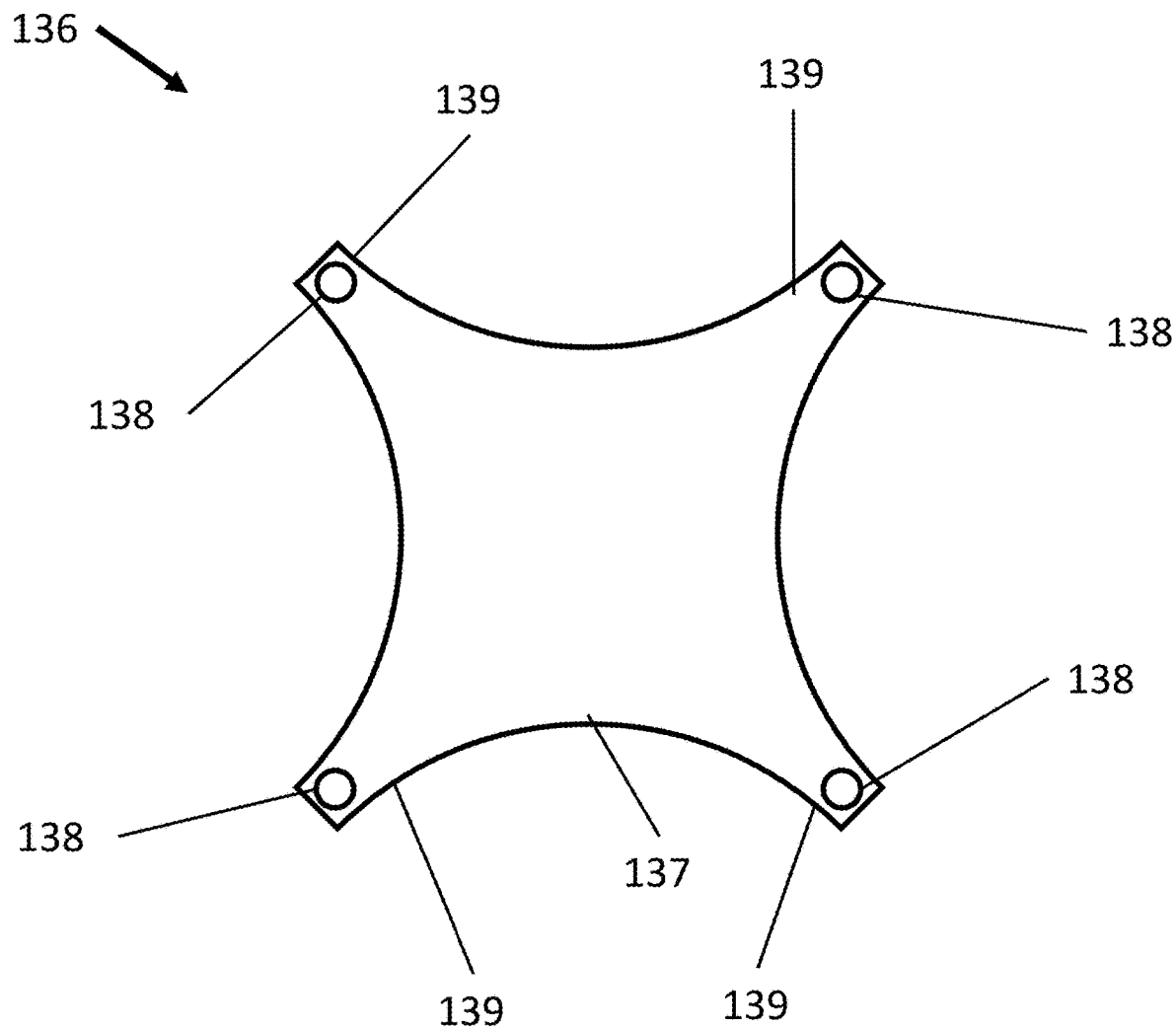
FIG. 1B illustrates an alternative arrangement of a bolster plate for use in the assembly of FIG. 1A.

An electronic assembly 10, shown in an exploded view in FIG. 1, includes a printed circuit board, or PCB 14, a heat sink 18, removable mounts 26, and a stiffener or bolster plate 36. The heat sink 18 is illustrated diagrammatically, and may be of different proportions and may include more complex features such as fins as appropriate for a given application. In the example shown, the PCB 14, heat sink 18, and bolster plate 36 each have a generally rectangular footprint of equal or nearly equal dimensions. It should be understood that in other examples the bolster plate, heat sink, and PCB may have any of a variety of other shapes, sizes, and configurations. Further, perimeters of the bolster plate, heat sink, and PCB need not be of equal dimensions. For example, the bolster plate 136 of FIG. 1B has a non-rectangular footprint provided by four arms 139 extending from a center portion 137, with bolster plate holes 138 at outer ends of the arms 139. The PCB 14 of the illustrated example includes a chip 16, such as a central processing unit, standing higher than the rest of the PCB 14. The chip 16 may be removable from the PCB 14, and may generate most of the heat in the system, but the chip 16 will generally be referred to as part of the PCB 14 throughout the disclosure. Reference to heat generated by the PCB 14 therefore includes heat generated by the chip 16 specifically. Further, reference to a surface of the PCB 14, or to contacting the PCB 14, may refer to a surface of the chip 16.

In the illustrated example, a load cell 22 extends along each of the four corners of the heat sink 18 for retention of other elements of the assembly 10 against a lower end of the heat sink 18. Directional terms such as "upper," "lower," "above," and "below" are used here to refer to the orientation of elements within the views provided by FIGS. 1-3. Apparatus and methods according to the current disclosure may exist in any orientation. Upper ends of the mounts 26 include features for engagement with the load cells 22, while lower ends of the four mounts 26 include features for extending through PCB holes 34 and engaging with internally threaded bolster plate holes 38. The mounts 26 thereby act to align the bolster plate 36 with the PCB 14 and enable the load cells 22 to pull the lower end of the heat sink 18 against the PCB 14 and bolster plate 36. In a fully assembled state, the mounts 26 hold the PCB 14 against the bolster plate 36 and transfer force from the load cells 22 to the bolster plate, so the bolster plate 36 applies upward force against the PCB 14.

Though the illustrated example of the assembly 10 includes four load cells 22, mounts 26, PCB holes 34, and bolster plate holes 38, other examples only include two load cells 22, mounts 26, PCB holes 34, and bolster plate holes 38 on opposite corners of the assembly 10.

Figure 2:
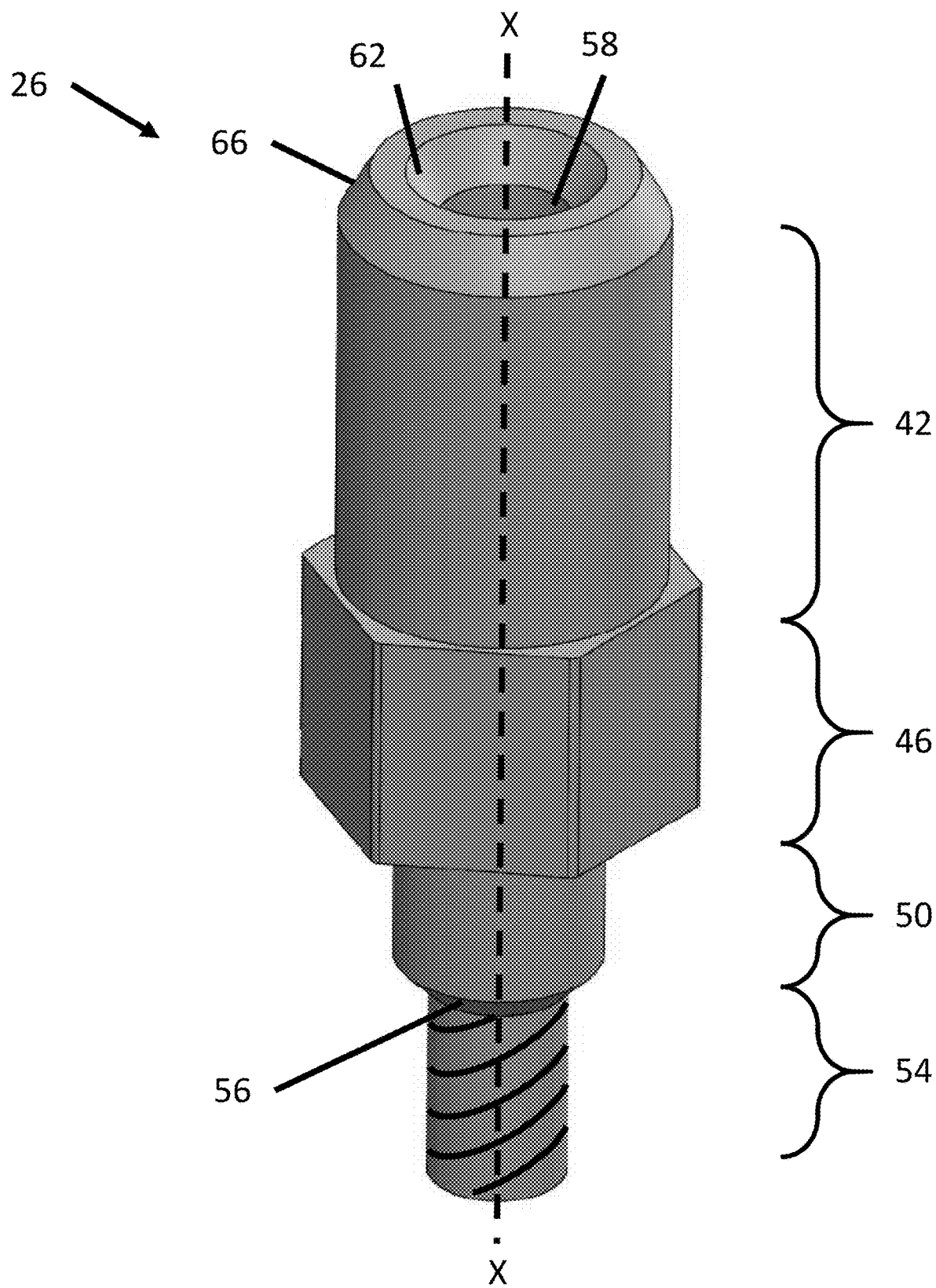
FIG. 2 is a perspective view of a mount of the assembly of FIG. 1A.
Figure 3A:
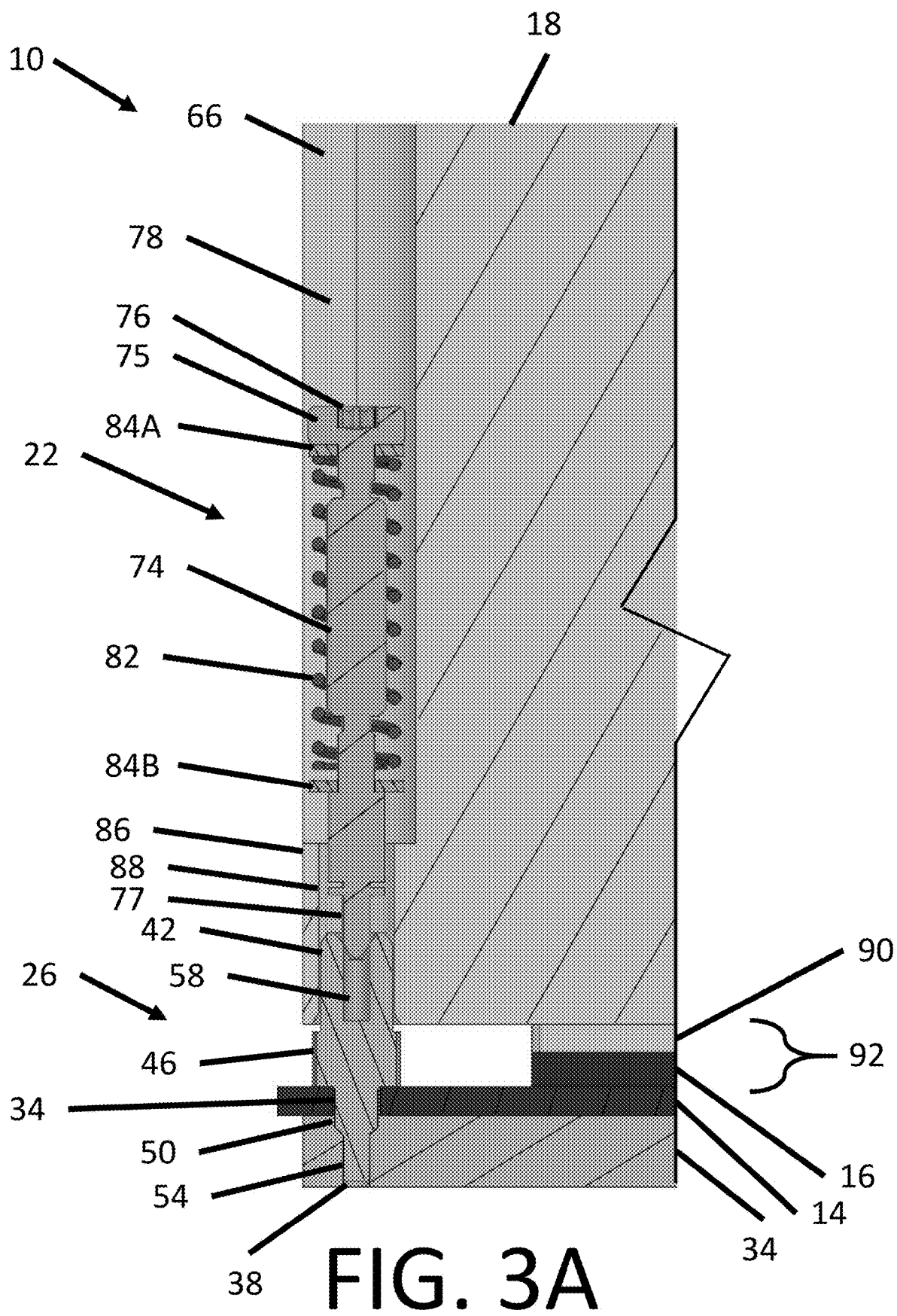
FIG. 3A is a cross-sectional view of a part of the assembly of FIG. 1A in a fully assembled state.

As shown in FIG. 2, each mount 26 of the illustrated example includes, from top to bottom, an upper barrel 42, a grip 46, a lower barrel 50, and an externally threaded post 54 aligned along a central axis X. A lower chamfer portion 56 provides a transition between the lower barrel 50 and the post 54, and acts to guide a lower portion of the lower barrel 50 into an upper portion of a bolster plate hole 38. The lower chamfer portion 56 extends circumferentially around an end of the lower barrel 50 adjacent to the post 54, and decreases in diameter about the axis X with increasing proximity to the post 54. However, in other examples, no chamfer exists between the lower barrel 50 and the post 54. An upper surface of the upper barrel 42 is chamfered on its inner and outer perimeters, with an inner chamfer 62 extending toward the bore 58 to guide a threaded shank of a load cell 22 into the bore 58, and an outer chamfer 66 extending toward an outer circumference of the upper barrel 42 to guide the upper barrel 42 into a channel of the heat sink 18. A circumferential thickness of the upper barrel 42 therefore decreases with increasing proximity to an upper axial end of the mount 26.

The grip 46 of the illustrated example has a hexagonal axial cross-section, which facilitates the use of tools or fingers to thread the post 54 into the load cell holes 38. The grip 46 has other shapes in other examples, such as an oblong shape or an elongated shape with two flat sides. The axial cross-section of the grip 46 is larger than the PCB holes 34 and axial cross-sections of the lower barrel 50 or post 54. The axial cross-section of the lower barrel 50 is, in turn, larger than the axial cross-section of the post 54, but fits closely within the PCB hole. As such, the PCB 14 can be aligned with the bolster plate 36 by passing the post 54 and lower barrel 50 downward through a PCB hole 34 and threadingly engaging the post 54 within a bolster plate hole 38. In examples other than that illustrated, the relative cross-sectional shapes and sizes of the differing parts of the mount 26 can vary from what is shown in FIG. 2. In some examples, the mount 26 may be cylindrical in shape with uniform diameter along its entire axial length. In other examples, portions of the mount 26 may have other oblong or polygonal cross-sectional shapes.

Because the axial cross-section of the grip 46 is greater than the PCB holes 34, tightening the threaded engagement of the post 54 within a bolster plate hole 38 causes a lower surface of the grip 46 to bear against the PCB 14 and retain the PCB 14 against the bolster plate 36 as shown in FIG. 3. In the fully assembled state of the assembly 10, each mount 26 is engaged with the bolster plate 36 through the PCB 14 and each load cell 22 is engaged with a mount 26 according to FIG. 3. In the illustrated example, the bolster plate hole 38 includes a flared upper portion for accepting the lower chamfer 56 and a lower portion of the lower barrel 50, but in other examples the bolster plate hole 38 is of uniform diameter such that the lower barrel 50 abuts an upper surface of the bolster plate 36 when the post 54 is threaded far enough into the bolster plate hole 38.

The PCB hole 34 fits closely around the lower barrel 50. The PCB holes 34 each have approximately the same diameter as the lower barrels 50. The mounts 26 therefore act to align and hold the PCB 14 to the bolster plate 36 regardless of the presence or location of the heat sink 18. For example, if the assembly 10 experiences an impact or sudden movement that overcomes the force applied by the load cells 22 to the mounts 26 and causes the heat sink 18 to travel away from the PCB 14, the PCB will remain safely aligned and retained to the bolster plate 36.

Each load cell 22 of the illustrated example includes a screw 74 extending through the center of a coil spring 82.

The screw 74 includes a head 75 at its upper end, and the head 75 in turn includes a socket 76 for engagement by a driving tool, such as a screw driver or hex key, for rotating the screw 74. In other examples, the head 75 can include outer features such as a hexagonal shape for driving by a wrench or other suitable tool. The spring 82 is bounded at an upper end by an upper plate 84A, which is fixed to the head 75, and at a lower end by a lower plate 84B, which is fixed to the heat sink 18. Downward movement of the screw 74 relative to the heat sink 18 therefore compresses the spring 82.

Each load cell 22 extends within a vertical recess 78 in a corresponding corner of the heat sink 18. A tab 86 extending from the heat sink 18 defines a lower end of the recess 78. A vertical channel 88 extends from the recess 78 through the tab 86 and opens at a lower surface of the heat sink 18. The channel 88 is large enough to receive the upper barrel 42 of a mount 26, as shown. Further, the spring 82 permits the screw 74 to extend into the channel 88 such that a threaded shank 77 at a lower end of the screw 74 can threadingly engage the bore 58 of the mount 26 while the upper barrel 42 is received in the channel 88. In the illustrated example, the channels 88 have approximately the same diameter as the upper barrels 42, so each upper barrel 42 fits tightly within one of the channels 88, thereby aligning the heat sink 18 to the PCB 14. In further examples the engagement between the screw 74 and the upper barrel 42 aligns the heat sink 18 to the PCB 14. Threading the shank 77 into the bore 58 transfers load of the compressed spring 82 to the mount 26. In turn, while the post 54 is threaded into the bolster plate hole 38, the force applied to the mount 26 by the spring 82 is transferred to the bolster plate 36, which applies upward pressure against a lower surface of the PCB 14. The mounts 26 therefore act to enable tightening or loosening of the PCB 14 against a lower surface of the heat sink 18 by turning the screws 74.

In the illustrated example, a conductive boss 90 extends from a lower surface of the heat sink 18 to contact the chip 16. The combined height 92 of the boss 90 and the chip 16 exceeds the height of the grip 46, so the load cells 22 can be tightened as necessary to establish effective contact between the boss 90 and the chip 16 without the grip 46 abutting the lower surface of the heat sink 18.

Figure 3B:
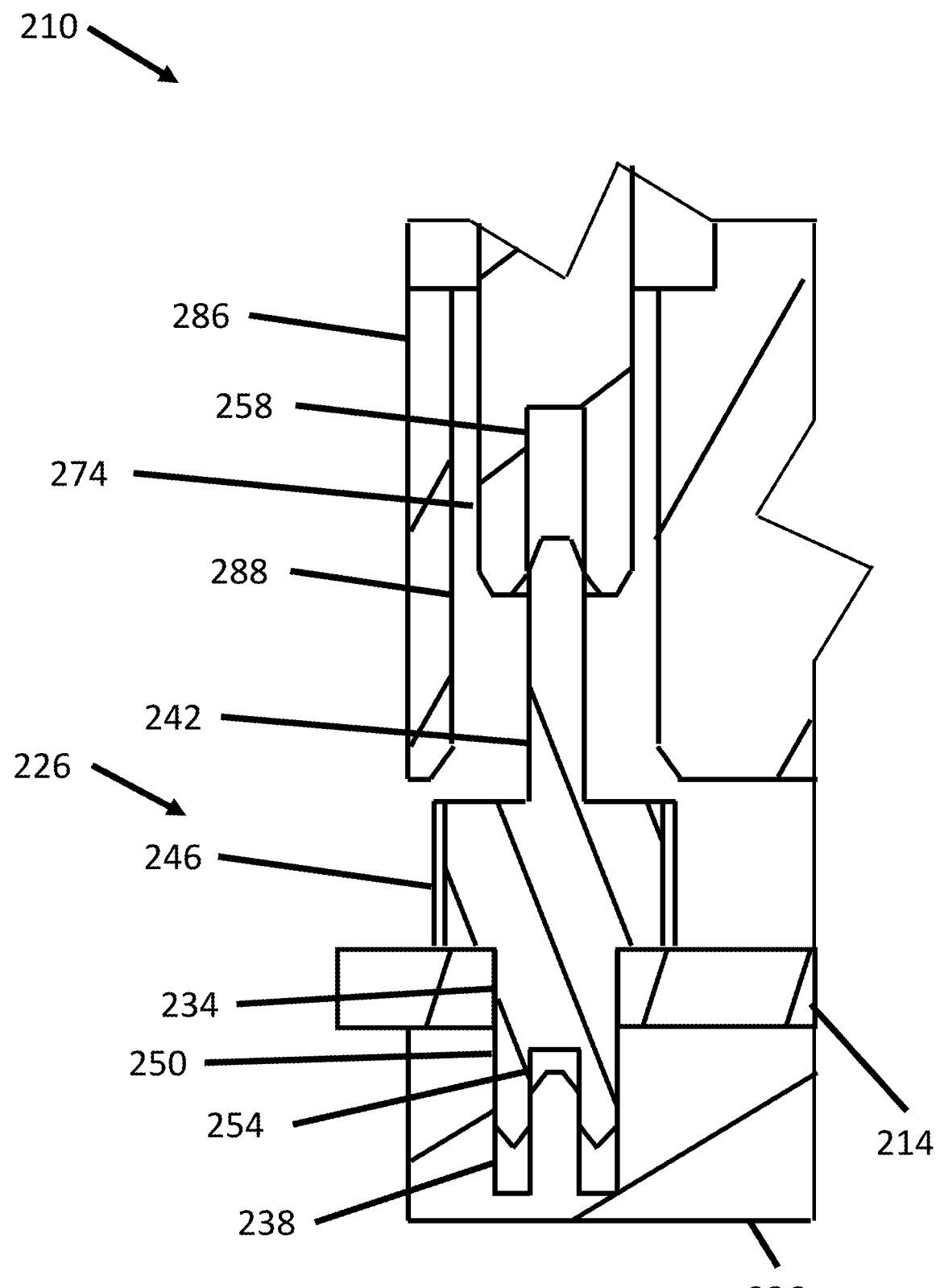
FIG. 3B is a cross-sectional view of a part of an assembly according to an alternative arrangement.

Other configurations for the assembly 10 and mounts 26 are contemplated. For example, in an assembly 210 according to an alternative arrangement illustrated in FIG. 3B, an upper barrel 242 of a mounts 226 lacks an internal bore and is externally threaded, extends into a channel 288 through a tab 286 and threads into an internally threaded bore 258 at a lower end of a screw 274. A lower barrel 250 of the mount 226, extending from a grip 246 in an opposite direction from the upper barrel 242, includes an internally threaded bore 254 for receiving externally threaded features of a bolster plate 236 disposed within the bolster plate holes 238. The lower barrel 250 extends through a PCB hole 234 to align a PCB 214 with the bolster plate 236. In various further examples, the features of the arrangement of FIG. 3B are combined with the features of the arrangement of FIG. 3A, such that the mount 26 are internally threaded at both ends or externally threaded at both ends, with corresponding internal or external threading on the screws 74 and bolster plate 36.

Figure 4:
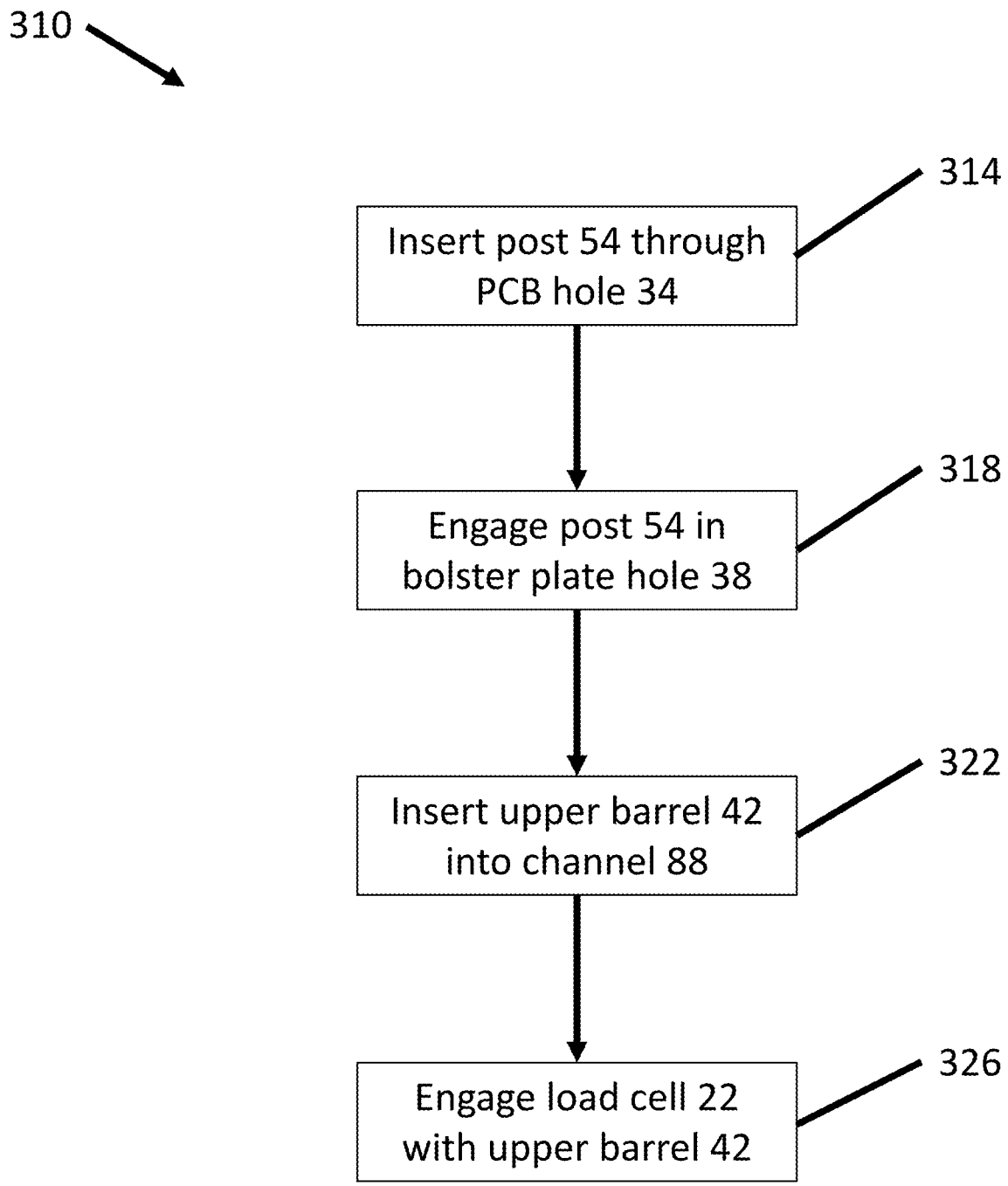
FIG. 4 is a flowchart illustrating a method of assembling the assemblies of FIG. 3A.

In a method of using the assembly 10, as illustrated in FIG. 4, the PCB 14 is arranged above the bolster plate 36, generally as shown in FIG. 1A. In particular, the PCB 14 is arranged such that the chip 16 faces away from the bolster plate 36. The mounts 26, in a number appropriate for a given application, are inserted post 54 first through the PCB holes 34 in a post-inserting step 314. The posts 54 are then threaded into the bolster plate holes 38 in a bolster-plate engagement step 318. The heat sink 18 is then arranged above the PCB 14 and bolster plate 36 generally as shown in FIG. 1A, with the contact 90 facing the PCB 14. The heat sink 18 is lowered until the upper barrels 42 are guided into the channels 88 in an upper barrel insertion step 322. The load cells 22 are then used to tighten the heat sink 18 down onto the PCB 14 by turning the screws 74 to thread the shanks 77 into respective bores 58 in a load cell engagement step 326. In alternative methods, the upper barrel engagement step 322 precedes the post insertion step 314. In further alternative methods, the load cell engagement step 326 precedes the post insertion step 314. In further alternatives, the posts 54 are passed through the PCB holes 36, then threaded into the bolster plate holes 38 before the load cells 22 are tightened down. The method illustrated in FIG. 4 and the alternative methods described above may similarly be applied to the assembly of FIG. 3B and other alternative examples described throughout the specification.

Unless otherwise stated, the foregoing alternative examples are not mutually exclusive, but may be implemented in various combinations to achieve unique advantages. As these and other variations and combinations of the features discussed above can be utilized without departing from the subject matter defined by the claims, the foregoing description of the embodiments should be taken by way of illustration rather than by way of limitation of the subject matter defined by the claims. In addition, the provision of the examples described herein, as well as clauses phrased as "such as," "including" and the like, should not be interpreted as limiting the subject matter of the claims to the specific examples; rather, the examples are intended to illustrate only one of many possible embodiments. Further, the same reference numbers in different drawings can identify the same or similar elements.

The invention claimed is:

1. An electronic assembly, comprising;
   a printed circuit board (PCB) including a chip and PCB holes;
   a bolster plate including bolster plate holes, each bolster plate hole being concentrically aligned with one of the PCB holes;
   a heat sink including notches and a boss configured to contact the chip at an opposite side of the PCB from the bolster plate;
   load cells extending within the notches and each being concentrically aligned with one of the PCB holes and one of the bolster plate holes; and
   one or more mounts, each including:
   a post extending along an axis and engaged with one of the bolster plate holes;
   a first barrel axially adjacent to the post and having a larger axial cross-section than the post;
   a second barrel defining an axially opposite end of the mount from the post and engaged with one of the load cells; and
   a grip located axially between the first barrel and the second barrel,
   wherein the second barrel is configured to be received within a corresponding notch of the heat sink, and
   wherein a combined height of the boss and the chip exceeds a height of the grip.

2. The assembly of claim 1, wherein each load cell includes a coil spring and a screw extending within the coil spring.

3. The assembly of claim 2, wherein the coil spring is confined between a first point at a fixed location relative to the screw and a second point at a fixed location relative to the heat sink.

4. The assembly of claim 2, wherein each of the screws includes an externally threaded portion engaged with an internally threaded bore within the second barrel of one of the mounts.

5. The assembly of claim 1, wherein the second barrel of each mount has a larger axial cross-section than the respective post.

6. The assembly of claim 5, wherein the PCB holes have an approximately equal diameter to the second barrels.

7. The assembly of claim 5, wherein each grip includes a flat surface abutting the PCB.

8. The assembly of claim 1, wherein the heat sink includes a tab defining an end of each notch, each tab including a channel extending therethrough, and each of the second barrels is disposed within one of the channels.

9. A method of assembling electronic components, the method comprising:

inserting a post of a mount through a printed circuit board (PCB) hole in a PCB and into a bolster plate hole in a bolster plate such that the post is threadingly engaged within the bolster plate hole, a portion of a first barrel axially extends from the post passes through the bolster hole and remaining portion of the first barrel extends through the PCB hole, and a grip extending axially from the first barrel bears against the PCB, wherein the PCB includes a chip;

engaging a load cell of a heat sink with an opposite end of the mount from the post, wherein the heat sink includes a boss such that a combined height of the boss and the chip exceeds a height of the grip; and tightening the load cell to bring the chip on the PCB into abutment with the boss of the heat sink.

10. The method of claim 9, comprising engaging the post with the bolster plate hole and tightening the mount to the bolster plate until the PCB contacts the bolster plate and a grip of the mount abuts an opposite side of the PCB from the bolster plate.

* * * * *